United States Patent [19]

Kumihashi et al.

[11] Patent Number: 5,409,562
[45] Date of Patent: Apr. 25, 1995

[54] DRY-ETCHING METHOD AND APPARATUS

[75] Inventors: Takao Kumihashi, Kokubunji; Kazunori Tsujimoto, Higashiyamato; Shinichi Tachi, Sayama, all of Japan

[73] Assignee: Hitachi, Ltd., Tokyo, Japan

[21] Appl. No.: 922,480

[22] Filed: Jul. 31, 1992

[30] Foreign Application Priority Data

Aug. 16, 1991 [JP] Japan .................................. 3-205974

[51] Int. Cl.⁶ .......................................... H01L 21/00
[52] U.S. Cl. .................................... 156/626; 156/643; 156/646; 156/662; 156/657; 156/664; 156/345
[58] Field of Search ............... 156/643, 646, 662, 664, 156/656, 657, 345, 626; 118/712, 723 MW, 726, 723 ME, 723 MR, 723 MA; 204/192.34, 298.31, 298.32, 298.33, 298.38, 298.36, 192.33, 192.37

[56] References Cited

U.S. PATENT DOCUMENTS

| | | | |
|---|---|---|---|
| 4,028,155 | 6/1977 | Jacob | 156/643 |
| 4,253,888 | 3/1981 | Kikuchi | 156/643 X |
| 4,659,449 | 4/1987 | Watanabe | 156/345 X |
| 4,786,389 | 11/1988 | Stark et al. | 156/643 |
| 4,857,137 | 8/1989 | Tachi et al. | 156/640 |
| 4,948,462 | 8/1990 | Rossen | 156/643 |
| 5,002,632 | 3/1991 | Loewenstein et al. | 156/643 |
| 5,110,407 | 5/1992 | Ono et al. | 156/345 X |
| 5,147,498 | 9/1992 | Nashimoto | 156/626 X |

FOREIGN PATENT DOCUMENTS

| | | |
|---|---|---|
| 305268 | 3/1989 | European Pat. Off. |
| 443154 | 8/1991 | European Pat. Off. |
| 60-158627 | 8/1985 | Japan |
| 63-110726 | 5/1988 | Japan |
| 63-291423 | 11/1988 | Japan |
| 100921 | 4/1989 | Japan |
| 179326 | 7/1989 | Japan |

OTHER PUBLICATIONS

Patent Abstracts of Japan, vol. 13, No. 558 (E-858), Dec. 12, 1989 of JP-A-1231326.
Winters et al, "Energy Transfer from Rare Gases to Surfaces: Collisions with Gold and Platinum in the Range 1–4000 eV", The American Physical Society, Physical Review B, vol. 41, No. 10, Apr. 1, 1990, pp. 6240–6254.
Patent Abstracts of Japan, vol. 7, No. 123 (E-178), May 27, 1983, of JP-A-042236.
Derwent Publications Ltd Abstract of JP-A-021271, Feb. 17, 1979, Week 7912.
Patent Abstracts of Japan, vol. 6, No. 57 (C-98), Apr. 14, 1982 of JP-A-169776.
Derwent Publications Ltd Abstract of JP-A-5-6-137637, Oct. 27, 1981, Week 8149.
Journal of Vacuum Science Technology, vol. B4, No. 1, Mar./Apr. 1986, "Chemical Sputtering of Silicon by F+, Cl+ and Br+ Ions Reactive Spot Model for Reactive Ion Etching", Tachi et al, pp. 459–467.
Journal of Applied Physics, vol. 64, No. 1, Jul. 1988, "Mechanisms of Sputtering of Si in a Cl2 Environment by Ions With Energies down to 75 eV", Oostra et al, pp. 315–322.

*Primary Examiner*—Thi Dang
*Attorney, Agent, or Firm*—Fay, Sharpe, Beall, Fagan, Minnich & McKee

[57] ABSTRACT

In microwave dry etching, the substrate/resist etching selectivity is controlled by adding a material, such as an additional gas, to the reaction gas plasma that heats the substrate with greater energy transfer efficiency than the resist. For example, a W substrate having a resist is etched with an $SF_6$ reaction gas to which is added an Xe gas for generating incident ions that impinge the substrate with greater energy transfer than they do the resist. This produces a greater hot spot temperature for the substrate as compared with the resist to increase the substrate/resist etching selectivity. The hot spot temperature difference can be further effected by applying a bias potential to the substrate during the etching with an RF power supply.

30 Claims, 5 Drawing Sheets

DRY-ETCHING METHOD AND APPARATUS

BACKGROUND OF THE INVENTION

The present invention relates to a dry-etching method and apparatus used in a process for producing semiconductors and, particularly, to a dry-etching method and apparatus capable of achieving highly selective etching.

In a conventional dry-etching method, a reaction is triggered by active species from the plasma of a reactive gas. The reaction is promoted by the incident energy of the ions, but reaction anisotropy develops since there is anisotropy in the incident direction of the ions.

In this case, the energy of the incident ions is transferred to the surface of the material to be etched to locally heat that portion, and the etching reaction proceeds very quickly due to the hot spot which is produced by the local heating (see, e.g., Journal of Vacuum Science and Technology, B4, 1986, p. 459). The measurement of the hot spot temperature has been reported in the Journal of Applied Physics, 64, 1988, p. 315. In low-temperature etching technology (Japanese Patent Laid-Open No. 158627/1985, Japanese Patent Laid-Open No. 63291423), the sample is maintained at a very low temperature to suppress the etching caused by the spontaneous reaction of incident particles such as radicals, and the etching reaction is established at the hot spot only in order to achieve realize high anisotropy.

In the conventional dry-etching method, however, hot spots are produced on portions that are desired to be etched as well as on portions that are not desired to be etched due to ions incident from the plasma. Furthermore, the temperature of the hot spots has not been particularly controlled and the hot spot temperature has thus been high. This can cause the etching reaction to proceed even on those portions that are not desired to be etched. Therefore, very highly selective etching is not realized.

In the conventional dry-etching method, furthermore, the temperature of a hot spot is not sufficiently raised on the surface of the material that is to be etched depending upon the combination of ions incident from the plasma and the material that is to be etched. Therefore, the etching rate is small and a sufficiently large selectivity is not obtained. This problem becomes conspicuous particularly when the material to be etched is one that contains heavy atoms such as tungsten (W) and the like.

Moreover, the conventional dry-etching apparatus is not provided with a mechanism for measuring and controlling the hot spot temperature. Therefore, the rate of the etching reaction is not sufficiently controlled, and the selectivity of the etching is small for the materials.

SUMMARY OF THE INVENTION

An object of the present invention is to provide a dry-etching method and a dry-etching apparatus capable of realizing highly selective etching of the materials.

The above-mentioned object is accomplished with a dry-etching apparatus in which the mass of the incident ions is controlled depending upon the atoms of the material that is desired to be etched and of the material that is not desired to be etched, by increasing the difference in mass between the atoms of the material that is desired to be etched and the atoms of the material that is not desired to be etched, and by providing the dry-etching apparatus with hot spot measurement and control capabilities.

In particular, the above object is accomplished by the following dry-etching methods, wherein:

(1) in the dry-etching method using plasma, the energy transfer efficiency from the incident ions to the atoms of the material to be etched is greater than the energy transfer efficiency from the incident ions to the atoms of the mask material or the energy transfer efficiency from the incident ions to the atoms of the mask material and of the underlying layer;

(2) ions having an atomic weight of greater than 60 are made incident at the time of etching the material containing atoms of an atomic weight greater than 60 by the plasma of a gas containing fluorine;

(3) ions having an atomic weight of greater than 60 are made incident on the material to be etched, in the method of dry-etching the material that is patterned using a carbon-containing photo-resist mask, by the plasma of a gas containing fluorine;

(4) a helium gas is used as an additive gas in the method of dry-etching the carbon-containing photo-resist material by the plasma of a gas;

(5) a material containing at least one kind of atom selected from He, Li, Be and B in an amount of more than 1% is used as a masking material; and is further accomplished by the dry-etching apparatus wherein:

(1') the dry-etching apparatus has an ion source capable of controlling the energy and ion seeds, a radical source and a method of time-of-flight measurement for measuring the temperature of the hot spots on the surface of the sample.

The temperatures of the hot spots vary depending upon the incident energy of the ions and the energy transfer efficiency from the ions to the atoms of a solid material. Further, the energy transfer efficiency is determined by a mass ratio of an ion to an atom of a solid material. Here, if the incident energy of an ion is denoted by E, the mass of an ion by $M_1$, the mass of an atom of a solid material by $M_2$, the energy which the atom of solid material receives from the ion by T, and a mass ratio of the atom of a solid material to the ion by $M_2/M_1 = A$, then a rate T/E at which the energy is given to the atom of a solid material when the ion comes into collision with the atom of solid material head-on is expressed by, $$T/E = 4A/(1+A)^2 \qquad (1)$$

This equation is derived from the conservation of momentum and the conservation of energy principles.

In practice, the energy is transferred from the incident ions to the surface of a solid material not only by the ions that collide head-on with atoms of a solid material, but also by ions that impact the surface at a scattering angle. In this case, however, merely a coefficient of $\sin^2\phi$ is multiplied when the scattering angle is $\phi$, and the equation (1) can be used to represent the energy transfer efficiency.

FIG. 3 shows a relationship between the energy transfer efficiency from the ions to the surface of a solid material and the mass ratio A of the ions to the atoms of a solid material. The energy transfer efficiency becomes the greatest when the ion and the atom of a solid material have an equal mass (A=1) and decreases as the mass ratio deviates from 1, i.e., as the difference in the mass increases between them. When the energy transfer efficiency is high, the energy of incident ions is quickly transferred to the surface of a solid material and the temperature of the hot spot becomes high. When the energy transfer efficiency is low, the temperature of the hot spot becomes low.

FIG. 4 is a diagram which specifically illustrates the relationships between atomic weights of atoms of solid materials and the energy transfer efficiency when incident ions are comprised of He+, Ne+, Ar+, Kr+ and Xe+. The masses of these noble gas ions are nearly the same as the masses of halogen ions that are widely used in conventional dry etching; therefore, FIG. 4 further illustrates the transfer efficiency from various halogen ions over the same range of atomic weights.

The feature of the present invention resides in that the hot spot temperature on the surface of a solid material is controlled by controlling the energy transfer efficiency. This feature will now be described with reference to a first embodiment of the invention using the etching of W with an $SF_6$ gas plasma as an example, with the understanding that this embodiment is similarly suitable for the etching of Ta, Pb and Zr.

In the conventional W etching, the energy transfer efficiency from the incident F+ ion into W is as low as 0.34 and, hence, the hot spot temperature is low and the etching rate is small. As is obvious from FIG. 4, furthermore, the energy transfer efficiency from an F+ ion to the C atom of the resist or to Si is close to 1. With Si or resist, therefore, the hot spot temperature is high, and the etching rate is large. Therefore, the selectivity is small between W and Si or the resist.

It will be understood from FIGS. 3 and 4 that if ions having a mass close to W are permitted to be incident, the energy transfer efficiency is improved, making it possible to increase the hot spot temperature of W. The same is true if Xe+ ions are made incident during the etching of Ta, Pb and Zr, according to FIG. 4. If Xe+ ions are used with W, the energy transfer efficiency becomes close to 1. In this case, the energy transfer efficiency to Si or C having a mass different from that of W becomes as small as 0.6, and the hot spot temperature decreases causing the etching rate to become small and making it possible to obtain a large selectivity.

From the above fact, furthermore, it becomes possible to increase the etching selectivity by controlling the hot spot temperature by increasing the difference in the mass between a material that is to be etched and a material that is not to be etched. As for the resist mask, for instance, there may be added He, Li, Be or B, each of which has a mass smaller than that of C, to lower the etching rate.

The hot spot temperature also varies depending upon the energy of incident ions and upon conditions specific to the material to be etched. Optimum energy of the incident ions can be detected by providing the etching device with a method for measuring the hot spot temperature. It becomes further possible to automatically control the energy of the incident ions by utilizing the measured hot spot temperature to adjust or set the parameters of etching, such as the bias potential applied to the sample, etc.

DETAILED DESCRIPTION OF THE PREFERRED EMBODIMENTS

Figure 1:
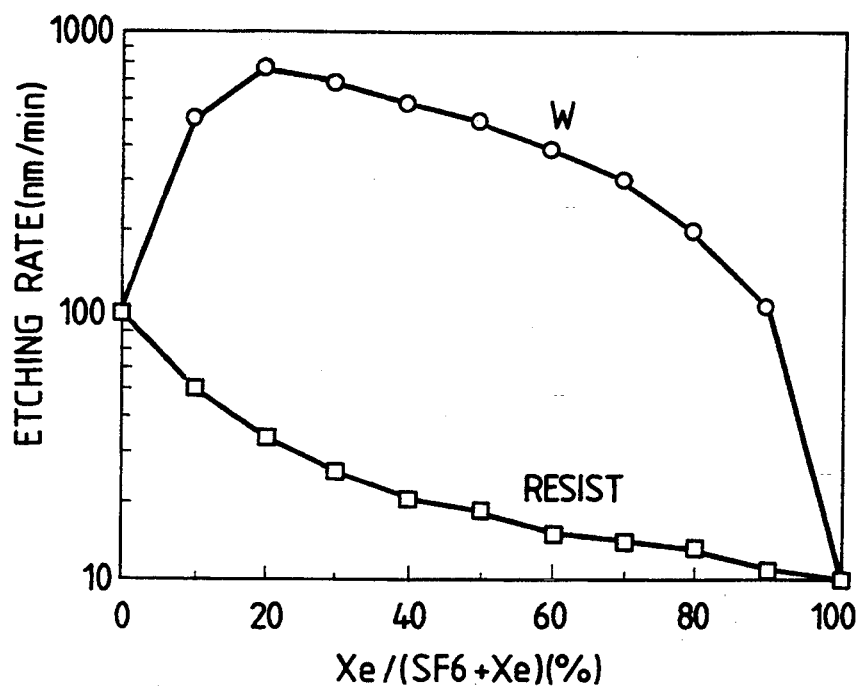
FIG. 1 is a diagram illustrating a relationship between the ratio of Xe added to an $SF_6$ gas and the etching rate of W by a dry-etching method according to a first embodiment of the present invention.

FIG. 1 shows the relationship between the amount of Xe added to $SF_6$ gas in the dry etching of W according to a first embodiment of the present invention.

The dry etching of W has heretofore been carried out using the plasma of a gas containing fluorine, such as $SF_6$ gas plasma. The rate of etching W based on the conventional $SF_6$ gas plasma is small and when the etching is conducted at a temperature as low as $-30°$ C. the etching rate is 100 nm/min (when $Xe/(SF_6+Xe)=0\%$ in FIG. 1). Under this condition, the rate of etching of the resist is 100 nm/min and the W/resist etching selectivity becomes 1. Therefore, $SiO_2$ has heretofore been used as a masking material to etch W.

When $SF_6$ gas plasma is used, the rate of etching W is small because the ratio of mass between the W atoms and the incident ions is great and, hence, the energy of the incident ions is not efficiently transferred to the surface of the W material, causing the hot spot temperature to remain low. That is, the atomic weight of W is 184, the atomic weight of F+, which is a principal incident ion seed, is 19, and the mass ratio is: W/F=9.7. Therefore, the energy transfer efficiency from the incident ions to W is as low as 0.34. If the transfer efficiency is improved, the etching rate can be increased to be comparable to that of the case of Si etching (mass ratio Si/F=1.5, energy transfer efficiency 0.96).

In this embodiment, use is made of Xe having a mass comparable to that of W. Since the atomic mass of Xe is 131, the mass ratio is: W/Xe=1.4, and the energy transfer efficiency from the incident ions to W is 0.97. Thus, the energy of the incident ions is efficiently transferred to W, and the hot spot temperature can be increased. Here, the Xe gas is a noble gas which can be safely used as an additive gas to $SF_6$ or as an ion source without seriously affecting the characteristics of the plasma. Furthermore, the first ionization potential of Xe is as low as 12.13 eV as compared with the first ionization potential of 17.4 eV of F, and the ionization efficiency of Xe is high in the plasma.

In the experiment of this embodiment, the flow rates of $SF_6$ gas and Xe gas are adjusted to etch W based on the plasma of an $SF_6+Xe$ gas. The electric discharge is that of a microwave discharge that offers good ionization efficiency. The gas pressure is 1 Pa and the sample temperature is $-30°$ C. in order to suppress an undesired etching reaction such as side etching caused by radicals.

As is evident from the diagram of FIG. 1, the energy transfer efficiency of the incident ions to W increases with an increase in the amount of Xe added to $SF_6$ during the initial stage, and the etching rate of W increases. As the amount of Xe added further increases, however, the amount of $SF_6$ decreases and the etching rate of W consequently decreases. Under the conditions of this embodiment, the etching rate of W becomes the greatest when the mixing ratio of Xe is 20%, i.e., about 700 nm/min.

On the other hand, the rate of etching of the resist decreases with an increase in the mixing ratio of Xe. One of the reasons for this is that the amount of etchant decreases due to the decrease in the ratio of $SF_6$. When the mixing ratio of Xe is 10%, however, the rate of etching of the resist is 50 nm/min, which is a 50% reduction from when the mixing ratio of Xe is 0%. This is due to a reduction in the energy transfer efficiency of the incident ions to the resist since the incident ion seed changes from $F^+$ into $Xe^+$ in addition to being affected by a decrease in the amount of the etchant.

The principal atoms of the resist are H and C. The atomic mass of H is as small as 1, and the mass ratio relative to the incident ion seed $H/M_1$ is usually smaller than 0.1. Therefore, the energy transfer efficiency from the incident ions to H is as small as 0.33, and the energy is transferred from the incident ions to the resist chiefly via C atoms. In the plasma of 100% $SF_6$ gas, the incident ions are chiefly $F^+$. Since the mass ratio is: $C/F=0.63$, the energy transfer efficiency from the incident ions to the resist is 0.95. If Xe is added to $SF_6$, the incident ions become chiefly Xe. In this case, the mass ratio is $C/Xe=0.092$ and the energy transfer efficiency becomes as small as 0.23. Therefore, addition of Xe lowers the hot spot temperature of the resist and lowers the etching rate.

Figure 2:
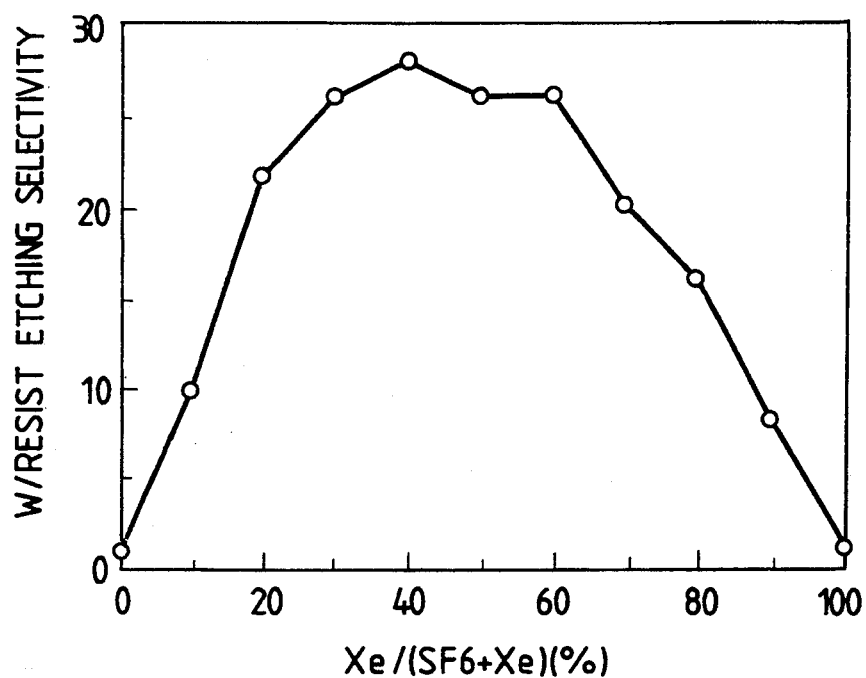
FIG. 2 is a diagram illustrating a relationship between the ratio of Xe added to an $SF_6$ gas and the W/resist etching selectivity of W by the dry-etching method of the first embodiment of the present invention.
Figure 3:
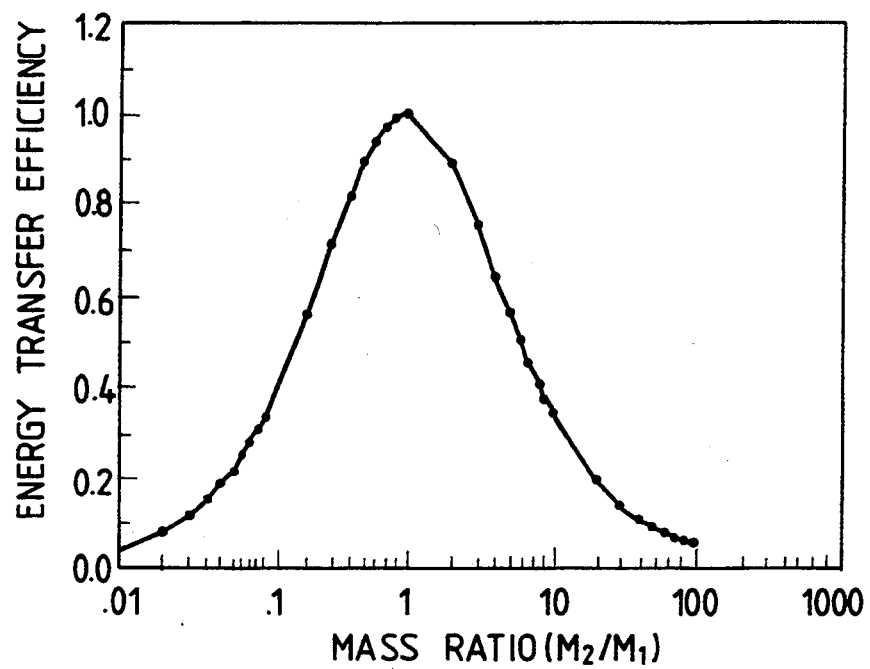
FIG. 3 is a diagram illustrating a relationship between the energy transfer efficiency from the ions in a dry-etching method to the surface of a solid material being etched and a mass ratio of the ions to the atoms of the solid material.

FIG. 2 is a diagram showing a relationship between the ratio of Xe added to $SF_6$ and the W/resist etching selectivity in this embodiment. When $SF_6$ is 100%, $Xe/(SF_6+Xe)=0\%$, the etching rate of W is small and is comparable with the rate of etching of the resist; i.e., the selectivity is 1. When Xe is added to the $SF_6$ gas, the W/resist etching selectivity increases due to an increase in the hot spot temperature of W and a decrease in the hot spot temperature of the resist. Under the conditions of this embodiment, the greatest selectivity of 28 is obtained with the rate of Xe added at an addition ratio of 40%. As the rate of Xe addition is further increased, the feeding amount of the etchant decreases, the rate of etching W becomes small and the W/resist etching selectivity decreases.

Figure 4:
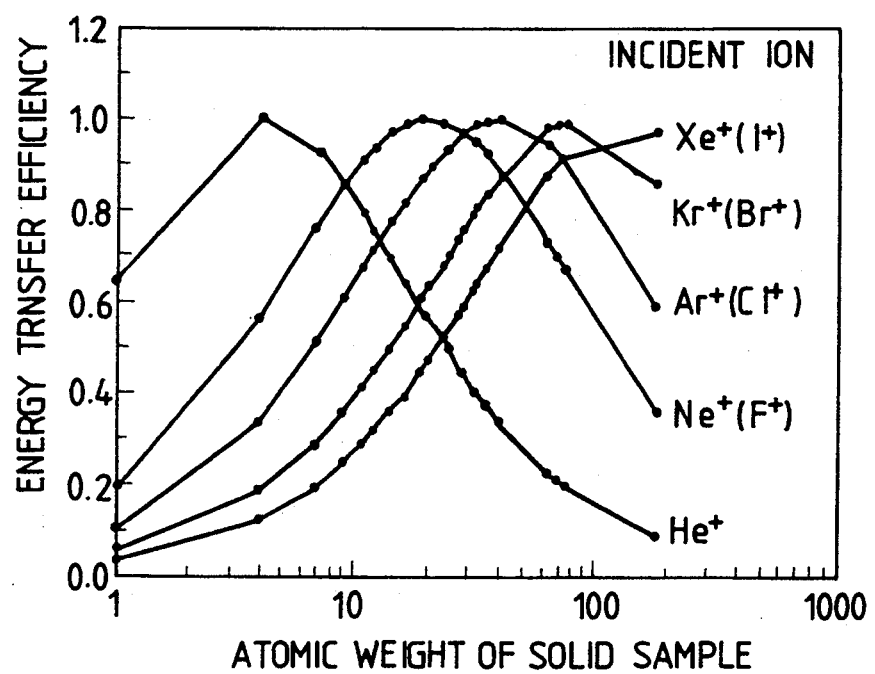
FIG. 4 is a diagram illustrating a relationship between the atomic weight of an atom of a solid material and the energy transfer efficiency thereof when the incident ions are He+, Ne+, Ar+, Kr+ and Xe+ in a dry-etching method.

As an alternative to using $Xe^+$ ions, it is also possible to use $Ar^+$ and $Kr^+$ ions as the incident ions in the etching of W, according to the first embodiment of the invention. As shown in FIG. 4, the energy transfer efficiency for Ar and Kr is less than that for Xe to W, but the W resist etching selectivity may still be suitable under certain conditions.

Further, in the foregoing description the etching of W was discussed, but the above-mentioned method can be effectively adapted to achieve highly selective etching of films that contain heavy elements such as $Ta_2O_5$ and PZT. From FIG. 4, it can be seen that the mass ratio of the heavy elements contained in such films to Ar, Kr and particularly Xe permit a high energy transfer efficiency of these ions to the atoms of the films while maintaining a correspondingly low energy transfer efficiency to the atoms of typical resist materials for thereby achieving highly selective etching of these types of films.

Figure 5:
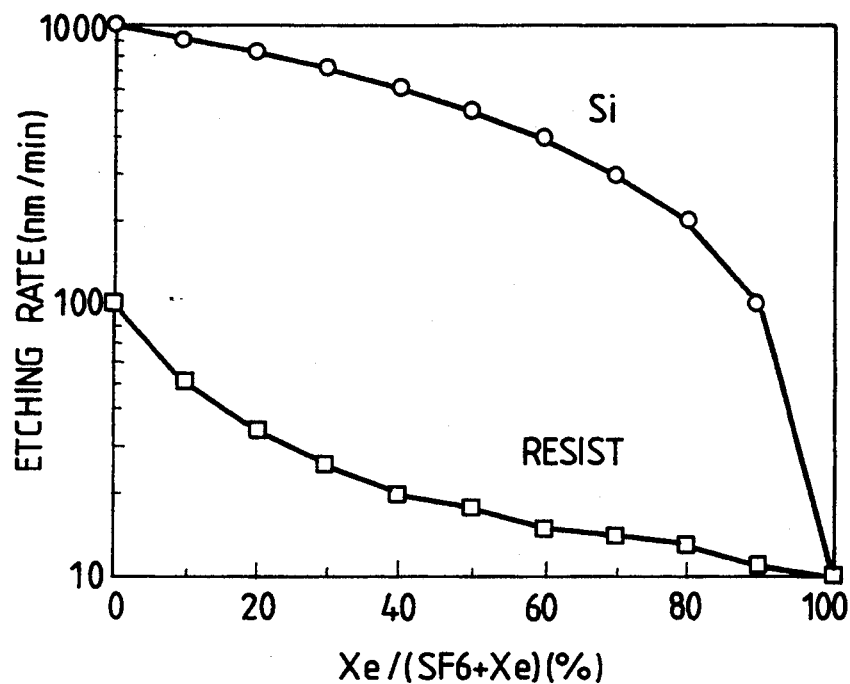
FIG. 5 is a diagram illustrating a relationship between the ratio of Xe added to an $SF_6$ gas and the etching rate for Si by a dry-etching method of another embodiment of the present invention.

FIG. 5 is a diagram showing the results of dry-etching Si using an ($SF_6+Xe$) gas mixture by the dry-etching method according to another embodiment of the present invention.

When Xe is added to the $SF_6$ gas, the energy transfer efficiency of Xe to the resist becomes as small as 0.23 as described in embodiment 1, the hot spot temperature on the resist surface decreases and the rate of etching of the resist becomes very small. On the other hand, the mass ratio of Si/Xe is 0.21 and the energy transfer efficiency is as small as 0.57 which, however, is about twice as great as the energy transfer efficiency to the resist of 0.23. Therefore, the hot spot temperature of Si affected by the Xe ions becomes higher than the hot spot temperature of the resist. However, since the transfer efficiency is about 60% of the energy transfer efficiency of $F^+$ to Si, which is 0.96, the addition of the Xe gas causes the amount of the etchant to decrease and the hot spot temperature to decrease even under the same etching conditions, and the rate of etching Si becomes very small, like that for the resist.

However, the energy transfer efficiency of $Xe^+$ to Si is 0.57 which is greatly different from that of the energy transfer efficiency of $Xe^+$ to the resist of 0.23, and there exists a large difference in the hot spot temperature between these surfaces. Therefore, a suitable bias potential is applied to the sample in order to control the hot spot temperature on the surface of Si to be a temperature at which the etching reaction takes place, and the hot spot temperature on the surface of the resist to be a temperature at which the etching reaction does not take place.

In the case of this embodiment, the microwave plasma etching is carried out while applying a bias of a frequency of 13.56 MHz at a power of 100 W to the sample. The bias may be applied by any other conventional method. In order to suppress the etching reaction by radicals, furthermore, the etching is carried out by maintaining a sample temperature at $-130°$ C. under a gas pressure of 1 Pa and changing the mixing ratio of $SF_6$ and Xe.

Under the above bias conditions, the hot spot temperature of Si rises to a temperature high enough to create the etching reaction due to the incidence of $Xe^+$. Therefore, the etching rate is decreased by the addition of Xe by only a rate at which the amount of etchant is decreased. On the surface of the resist, on the other hand, the hot spot temperature is not sufficiently elevated by the addition of $Xe^+$ under the above bias conditions, and the etching rate is greatly decreased by the addition of Xe.

Figure 6:
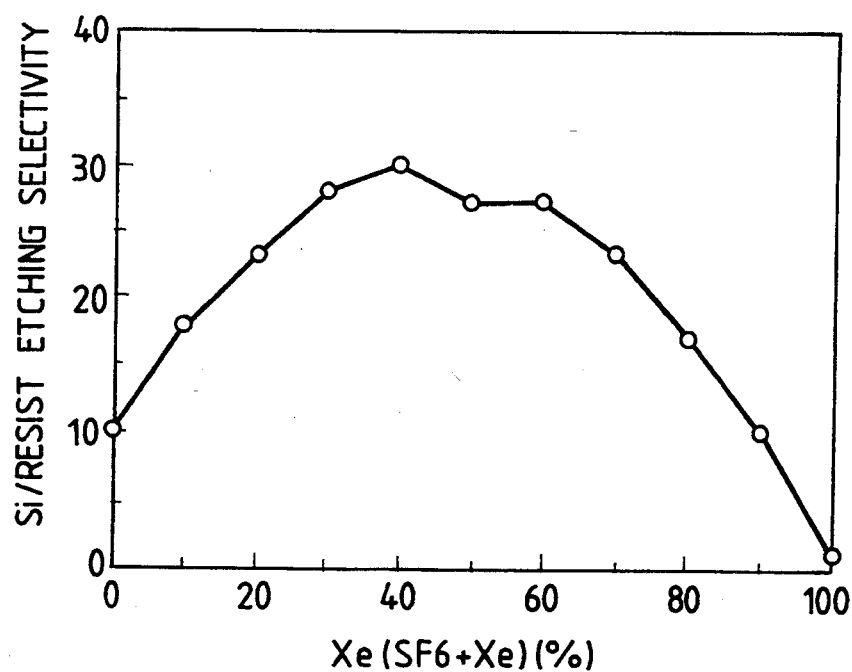
FIG. 6 is a diagram illustrating a relationship between the ratio of Xe added to an $SF_6$ gas and the Si/resist etching selectivity in a dry-etching method of the embodiment of FIG. 5.

FIG. 6 shows the relationship between the mixing ratio of Xe gas and the Si/resist etching selectivity in this embodiment. It will be understood that a very high selectivity, as high as 30, can be obtained with an Xe mixing ratio of 40%. Furthermore, the Si etching rate is 600 nm/min, which is large enough for practical applications.

The above etching method can even be applied to systems other than the $SF^6$/Xe mixture system in an Si/resist dry-etching method. That is, the incident ion seed is selected to develop a difference in the energy transfer efficiency between a material that is to be etched and a material that is not to be etched, and a suitable bias is applied to set the hot spot temperature of the material to be etched to a value high enough for the etching reaction to proceed, and to also set the hot spot temperature of the material that is not to be etched to a value at which the etching reaction is adequately decreased. Thus, highly selective etching can be performed.

The incident ions may be obtained, not only from a gas that is mixed into the plasma, but from an independent source of ions generated from a separate plasma source, for example, that is added to the etching chamber. Moreover, if a separate source of ions is generated for providing the incident energy, then neutral particles may be made to be incident instead of ions.

In an experiment according to this embodiment, an organic resist is used as a masking material. Though the energy transfer efficiency of $Xe^+$ to C is as small as 0.23, the addition of atoms having an atomic weight smaller than that of C as atoms of resist causes the energy transfer efficiency to further decrease and the selectivity to further increase. Examples of such atoms include He, Li, Be and B. Addition of at least one kind of these elements to the resist material in an amount greater than 1% enables the energy transfer efficiency from the incident ions to the resist mask to be decreased and the selectivity relative to Si to be increased. The resist mask can be effectively used even in the case of etching a material containing atoms having atomic weights greater than that of C. Similar effects can further be obtained by using inorganic resists such as diamonds, which consists chiefly of carbon, in addition to using organic resists.

Figure 7:
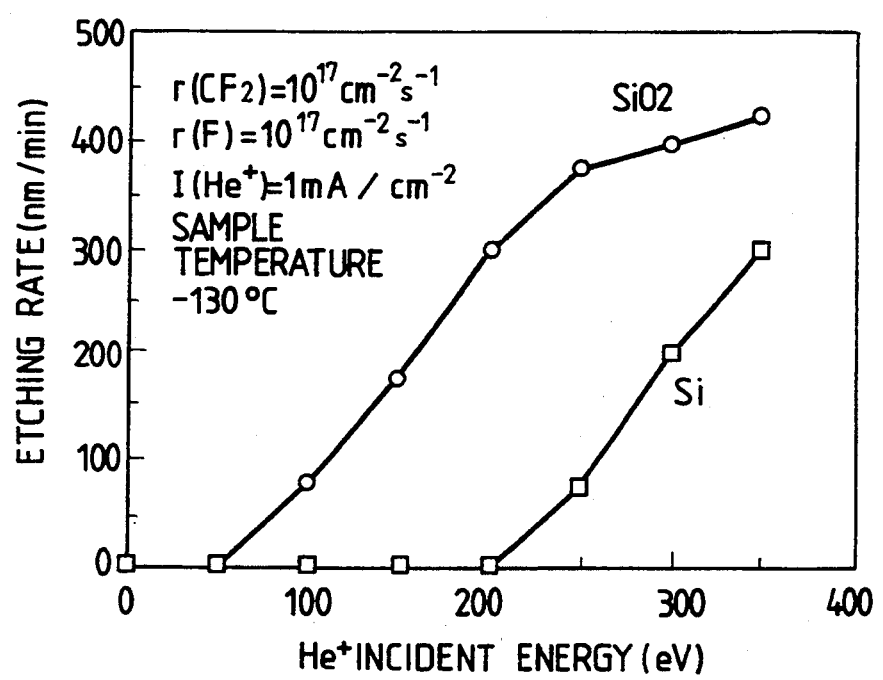
FIG. 7 is a diagram illustrating a relationship between the energy of He+ ions and the etching rates for $SiO_2$ and Si when $SiO_2$ and Si are etched using the etching apparatus that has an $F.CF_2$ radical source of He+ ions by a method of a further embodiment of the present invention.

FIG. 7 is a diagram illustrating a relationship between the energy of $He^+$ ions and the etching rates for $SiO_2$ and Si when $SiO_2$ and Si are etched by using an etching apparatus having a source of $F.CF_2$ radicals and a source of He ions according to an embodiment of the present invention.

$SiO_2$ includes oxygen (O) atoms. Therefore, the etching selectivity for Si can be improved if the energy transfer efficiency to O atoms is increased to be higher than that for the Si atoms. The energy transfer efficiency becomes the greatest when the mass of the incident ions is equal to the mass of the atoms of the solid material, and the energy transfer efficiency decreases with an increase in the mass ratio. In order to increase the energy transfer efficiency to O so that it is greater than the energy transfer efficiency to Si, therefore, ions lighter than O sould be used. In this embodiment, He ions are used as the incident ions.

The energy transfer efficiency of $He^+$ to O is 0.64 which is higher than the energy transfer efficiency to Si of 0.44. Therefore, the hot spot temperature of $SiO_2$ becomes sufficiently high with the $He^+$ incidence of 200 eV, and the etching rate is saturated with the feeding rate of radicals. With Si, on the other hand, the feeding rate is obtained with the $He^+$ incidence of 400 eV. It is therefore possible to obtain a selectivity of greater than 10 at around the $He^+$ incident energy of 200 eV.

Favorable results are exhibited to some extent even when an He gas is added to the conventional plasma of $CF_4$ gas. However, the first ionization potential of He is 24.6 eV which is greater than the ionization potential of F of 17.4 eV, and the He gas is not allowed to completely suppress the incidence of the $F^+$ ions. Further, the energy transfer efficiency from the $F^+$ ions to Si is 0.96, which is a little different from the energy transfer efficiency to O of 0.99. Therefore, the effect decreases with the plasma of $(CF_4+He)$ gas that is not capable of preventing the incidence of $F^+$ ions or $CF_x^+$ ions. In practice, however, there exists no problem if the discharge conditions are so set that $He^+$ becomes much more than $F^+$.

In etching a resist, such as a multi-layer resist, furthermore, it is possible to greatly increase the energy transfer efficiency to H in the resist to 0.64 by permitting the $He^+$ ions to act thereupon. A simple and efficient method consists of adding an He gas in etching the resist at a low temperature using the plasma of an $O_2+Cl_2$ gas.

Figure 8:
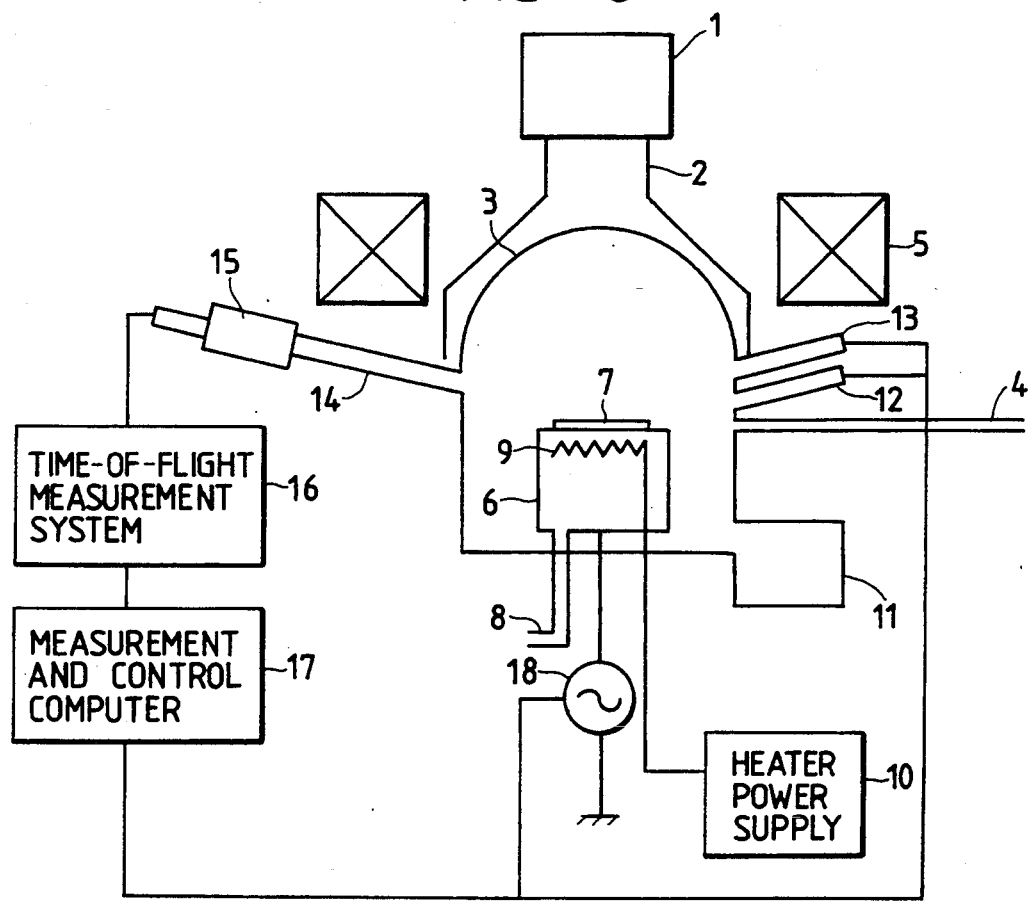
FIG. 8 is a diagram of a dry-etching apparatus constructed according to an embodiment of the present invention.

FIG. 8 is a diagram of a dry-etching apparatus constructed according to the present invention which comprises a magnetron 1, a waveguide 2, a discharge zone 3, a gas inlet 4, an electromagnet 5, a sample stage 6, a refrigerant inlet 8, a heater 9, a heater power supply 10, a vacuum pump 11, a radical source 12, an ion source 13, a flight tube 14, a quadrupole mass separator 15, a time-of-flight measurement system 16, a measurement and control computer 17, and an RF power supply 18.

In this apparatus, the microwaves generated by the magnetron 1 are guided through the waveguide 2 and are radiated into the discharge zone 3. Further, a gas of a predetermined pressure is introduced from the gas inlet 4 into the discharge zone 3, and a plasma is efficiently generated by the microwave electric discharge by using the electromagnet 5 in order to etch the sample 7 placed on the sample stage 6. The sample stage 6 is equipped with the refrigerant inlet 8 for cooling the sample to a low temperature. The heater 9 is provided with electric power from the heater power supply 10. A bias power is applied to the sample 7 from the RF power supply 18. Furthermore, the radical source 12, ion source 13, flight tube 14, quadrupole mass separator 15, time-of-flight measurement system 16, and measurement and control computer 17 are provided in order to measure the hot spot temperature, and the measurement and control computer 17 works to control the RF power supply 18, ion source 13 and radical source 12.

Described below is a method of measuring the hot spot temperature and a method of utilizing the measured results to adjust the etching parameters.

First, radicals of etchant are generated from the radical source 12 and are absorbed by the sample 7. Then, predetermined ions are permitted to be incident upon the sample 7 from the ion source 13 so that the etching reaction takes place at the hot spot and the reaction product is desorbed. In this case, the reaction product is desorbed at a rate in accordance with the Maxwell-Boltzmann distribution that reflects the hot spot temperature. Therefore, the desorption rate of the reaction product is found by the flight tube 14, quadrupole mass separator 15, and time-of-flight measurement system 16 to thereby measure the hot spot temperature. The measured results are analyzed by the measurement and control computer 17. The measurement and control computer 17 automatically controls the radical source 12 and the ion source 13 thereby to automatically find a relationship between the incident energy of ions of various masses and the hot spot temperature. The measurement and control computer 17 utilize the quadrupole mass separator 15 in order to simultaneously measure plural kinds of hot spot temperatures on the surface of the solid material. This measurement makes it possible to determine the ion seed and the incident energy of ions best suited for obtaining a hot spot temperature that helps accomplish the greatest selectivity. A bias power from the RF power supply 18 is set in order to set the energy of the incident ions.

In the apparatus of this embodiment as described above, even the RF power supply is controlled by the measurement of the hot spot temperature so that the optimum etching parameters can be achieved. Furthermore, the etching conditions that are found are stored in the measurement and control computer 17 in order to automatically adjust or set the etching parameters. In the case of polycrystalline and amorphous samples, the hot spot temperature is measured at around the etching conditions that are stored, though the hot spot temperatures vary depending upon the film-forming conditions thereby to automatically determine optimum conditions within short periods of time.

As described above, the dry-etching method and the dry-etching apparatus conducted according to the present invention are employed in a process for manufacturing semiconductors in order to solve the problems inherent in the prior art and to realize highly selective etching of the materials.

While a preferred embodiment has been set forth along with modifications and variations to show specific advantageous details of the present invention, further embodiments, modifications and variations are contemplated within the broader aspects of the present invention, all as set forth by the spirit and scope of the following claims.

What is claimed is:

1. A dry etching method comprising the steps of:
supporting a body having a first material to be etched and a second material not to be etched in a dry etching apparatus that performs dry etching;
supplying a reaction gas for the dry etching and adding to the reaction gas additional particles for heating during the dry etching;
forming a plasma of the reaction gas and the additional particles;
etching and heating the body with the plasma so that the transfer of energy from ions of the additional particles to the first material to be etched is greater than that of the ions to the second material not to be etched; and
controlling a hot spot temperature of the first material to be greater than that of the second material by monitoring the hot spot temperatures of the first and second materials and applying a bias potential to the body with an RF power supply in accordance with the monitoring.

2. A dry etching method according to claim 1, wherein the additional particles are atoms of a material having an atomic weight greater than 60 when said material to be etched has an atomic weight of greater than 60; and
wherein said reaction gas is a gas containing fluorine.

3. A dry etching method according to claim 2, wherein said additional particles are selected from the group consisting of Kr and Xe.

4. A dry etching method according to claim 3, wherein the ions of the additional particles are obtained from a gas wherein the gas is Kr or Xe that is added in an amount of 10 to 50% with respect to the reaction gas.

5. A dry etching method according to claim 2, wherein said material to be etched is tantalum, tungsten, lead or zirconium.

6. A dry etching method according to claim 1, wherein the material to be etched has an atomic weight of greater than 60, the additional particles are atoms of an atomic weight greater than 60, the reaction gas contains fluorine and the material not to be etched is a resist.

7. A dry etching method according to claim 6, wherein the atoms of the additional particles are from a gas wherein the gas is Kr or Xe, wherein the gas is added in a range of 10 to 50% with respect to the reaction gas, wherein the material to be etched is Ta, W, Pb or Zr, and wherein the reaction gas is $SF_6$.

8. The dry etching method according to claim 1, wherein the bias potential is applied to said body for increasing the incidence of said additional particle ions for increasing the heating of the body.

9. A dry etching method according to claim 1, wherein said material to be etched is Si and said material not to be etched is a mixture of resist and an additional element, and wherein said additional element is He, Li, Be or B.

10. A dry etching method comprising the steps of:
providing a body having a first material to be etched and a second material not to be etched in a dry etching apparatus;
supplying a reaction gas and an additional gas into the apparatus;
forming a plasma of the reaction gas and the additional gas;
selecting the additional gas to have a higher energy transfer efficiency from incident ions thereof to the atoms of the first material than to the atoms of the second material; and
etching the body with the plasma;
wherein a bias potential is applied to the body to increase a hot spot temperature during etching of the first material to be greater than that of the second material.

11. A dry etching method according to claim 10, wherein the first material is $SiO_2$ and the second material is Si, and wherein the additional gas is He and the reaction gas is $CF_4$.

12. A dry etching method according to claim 11, wherein a bias potential is applied to the body for increasing a hot spot temperature of the first material with respect to the second material to increase the first material/second material etching rate selectivity.

13. A dry etching method according to claim 10, wherein the first material is Ta, W, Pb or Zr, the second material is a resist, and the additional gas is Kr or Xe added in a mixing ratio of 10 to 50%.

14. A dry etching method according to claim 10, wherein the first material is Si, and the second material is a mixture of resist and an additional element, and wherein the additional element is He, Li, Be or B.

15. A dry etching method comprising the steps of:

providing a body having a first material to be etched and a second material not to be etched in a dry etching apparatus;

supplying a reaction gas and an additional gas into the apparatus;

forming a plasma of the reaction gas and additional gas;

selecting the additional gas to have a higher energy transfer efficiency from incident ions thereof to the atoms of the first material than to the atoms of the second material; and etching the body with the plasma;

wherein a bias potential is applied to the body and the magnitude of the bias potential is controlled by observing the hot spot temperature of the first and second materials to increase the first material/second material etching selectivity.

16. A dry etching apparatus, comprising:

a vacuum chamber having an etching zone;

means for supporting a body having a first material to be etched and a second material not to be etched in the etching zone;

first means for introducing a reaction gas into the vacuum chamber;

second means for introducing an additional gas into the vacuum chamber for heating the first material more than the second material, wherein the additional gas has a mass such that the first and second materials have different respective energy transfer efficiencies with respect to the additional gas;

first means for generating a first gas plasma with the reaction gas;

second means for generating a second gas plasma with the additional gas;

means for introducing the first and second plasmas into the etching zone for etching the body; and means for supplying a bias potential from an RF power supply to the body, means for measuring a hot spot temperature of the first and second materials, and means for controlling the RF power supply in accordance with the hot spot temperature that is measured so that the hot spot temperature of the first material is greater than that of the second material.

17. A dry etching apparatus according to claim 16, further comprising an electromagnet for generating a microwave plasma at said first and second means for creating the first and second gas plasma wherein the hot spot temperature measuring means includes a time-of-flight measurement system and quadrupole mass separator.

18. A dry etching apparatus according to claim 16, further comprising means for maintaining a temperature of the body between −30° C. and −130° C.

19. A dry etching apparatus according to claim 16, wherein said additional gas is Kr or Xe.

20. A dry etching apparatus, comprising:

a vacuum chamber having an etching zone;

means for supporting a body having a first material to be etched and a second material not to be etched in the etching zone;

first means for introducing a reaction gas into the vacuum chamber;

second means for introducing an additional gas into the vacuum chamber for heating the first material more than the second material, wherein the additional gas has a mass such that the first and second materials have different respective energy transfer efficiencies with respect to the additional gas;

first means for generating a first gas plasma with the reaction gas;

second means for generating a second gas plasma with the additional gas;

means for introducing the first and second plasmas into the etching zone for etching the body; and means for controlling the hot spot temperature of the body by controlling the volume ratio of the additional gas with respect to the reaction gas so that the first and second gas plasmas introduced into the etching zone etch the first material at a substantially greater rate than the second material.

21. A dry etching apparatus according to claim 20, wherein said means for controlling the hot spot temperature controls the second means for introducing an additional gas by controlling the volume of the additional gas introduced into the vacuum chamber.

22. A dry etching apparatus according to claim 20, further comprising means for maintaining a temperature of the body between −30° C. and −130° C.

23. A dry etching apparatus according to claim 20, wherein said additional gas is Kr or Xe.

24. A dry etching apparatus, comprising:

a vacuum chamber having an etching zone;

means for supporting a body having a first material to be etched and a second material not to be etched in the etching zone;

first means for introducing a reaction gas into the vacuum chamber;

second means for introducing an additional gas into the vacuum chamber for heating the first material more than the second material, wherein the additional gas has a mass such that the first and second materials have different respective energy transfer efficiencies with respect to the additional gas;

first means for generating a first gas plasma with the reaction gas;

second means for generating a second gas plasma with the additional gas;

means for introducing the first and second plasmas into the etching zone for etching the body; and means for controlling the etching selectivity between the first and second materials by controlling the hot spot temperature of the body.

25. A dry etching apparatus according to claim 24, further comprising means for maintaining a temperature of the body between −30° C. and −130° C.

26. A dry etching apparatus according to claim 24, wherein said additional gas is Kr or Xe.

27. A dry etching apparatus, comprising:

a vacuum chamber having an etching zone;

means for supporting a body having a first material to be etched and a second material not to be etched in the etching zone;

means for introducing etching particles into the etching zone for etching the body, wherein the etching particles have a mass such that the first and second materials have different respective energy transfer efficiencies with respect to the etching particles; and means for supplying a bias potential from an RF power supply to the body, means for measuring a hot spot temperature of the first and second materials, and means for controlling the RF power supply in accordance with the hot spot temperature that is measured so that the hot spot temperature of the first material is greater than that of the second material.

28. A dry etching apparatus according to claim 27, wherein the introducing means includes an electromagnet for generating a microwave plasma of said etching particles, wherein the hot spot temperature measuring means includes a time-of-flight measurement system and quadrupole mass separator.

29. A dry etching apparatus according to claim 27, wherein the etching particles are neutral particles.

30. A dry etching apparatus according to claim 27, wherein the means for introducing etching particles is a plasma source for introducing etching ions into the etching zone.

* * * * *